United States Patent [19]

Ohuchi et al.

[11] Patent Number: 4,766,377
[45] Date of Patent: Aug. 23, 1988

[54] PHASE CORRECTION METHOD IN TWO-DIMENSIONAL NMR SPECTROSCOPY

[75] Inventors: Muneki Ohuchi; Soukichi Uchida, both of Tokyo, Japan

[73] Assignee: Jeol Ltd., Tokyo, Japan

[21] Appl. No.: 110,941

[22] Filed: Oct. 20, 1987

[51] Int. Cl.[4] .................................. G01R 33/20
[52] U.S. Cl. ........................... 324/307; 324/309
[58] Field of Search ............... 324/300, 301, 304, 307, 324/309, 312, 313, 314, 318, 322; 128/653

[56] References Cited

U.S. PATENT DOCUMENTS

| | | | |
|---|---|---|---|
| 3,873,908 | 3/1975 | Young | 324/304 |
| 4,706,027 | 11/1987 | Hughes | 324/312 |
| 4,713,614 | 12/1987 | Hoshino | 324/307 |
| 4,720,679 | 1/1988 | Patrick et al. | 324/309 |

OTHER PUBLICATIONS

D. Marion and K. Wuthrich, "Application of Phase Sensitive Two-Dimensional *Correlated Spectroscopy (COSY) For Measurements of $^1H$—$^1H$ Spin-Spin Coupling Constants in Proteins*", Received May 18, 1983, Biochemical and Biophysical Research Communications, vol. 113, No. 3, 1983, Jun. 29, 1983, pp. 967–974.
D. J. States, R. A. Haberkorn and D. J. Ruben, "*A Two-Dimensional Nuclear Overhauser Experiment with Pure Absorption Phase in Four Quadrants*", Received Dec. 29, 1981, Journal of Magnetic Resonance 48, 286–292 (1982).

*Primary Examiner*—Michael J. Tokar
*Attorney, Agent, or Firm*—Webb, Burden, Ziesenheim & Webb

[57] ABSTRACT

There is disclosed a method of precisely correcting the phase of a two-dimensional NMR spectrum along the two axes. First, a first phase train is applied to a sample. After an evolution period of $t_1$, a second pulse train is applied. Then, the free induction decay signal emanating from the sample is detected during a detection period of $t_2$, using a quadrature detection system. This process is repeated with different values of $t_1$. Thus, a complex NMR spectrum $S_1(t_1, t_2)$ is obtained. Subsequently, the sample is excited with a pulse sequence which is similar to the first-mentioned pulse sequence except that the second pulse is shifted in phase by $90°/n$ (n is a natural number) with respect to the second pulse of the first-mentioned pulse sequence. The resulting free induction decay signal is detected. This process is repeated with the same number of different values of $t_1$ as the values of $t_1$ used in the first set of measurements. Thus, a complex NMR spectrum $S_2(t_1, t_2)$ is derived. The spectra $S_1(t_1, t_2)$ and $S_2(t_1, t_2)$ are subjected to complex Fourier transformation with respect to the axis $t_2$. Then, the imaginary part of $S_1(t_1, F_2)$ and the real part of $S_2(t_1, F_2)$ are interchanged to give rise to Fourier-transformed spectra $S_1'(t_1, F_2)$ and $S_2'(t_1, F_2)$, which are then subjected to complex Fourier transformation with respect to the axis $t_1$. The phase is corrected along one of the axes. The imaginary part of $S_1'(F_1, F_2)$ and the real part of $S_2(F_1, F_2)$ are interchanged. Then, the phase is corrected along the other axis.

3 Claims, 3 Drawing Sheets

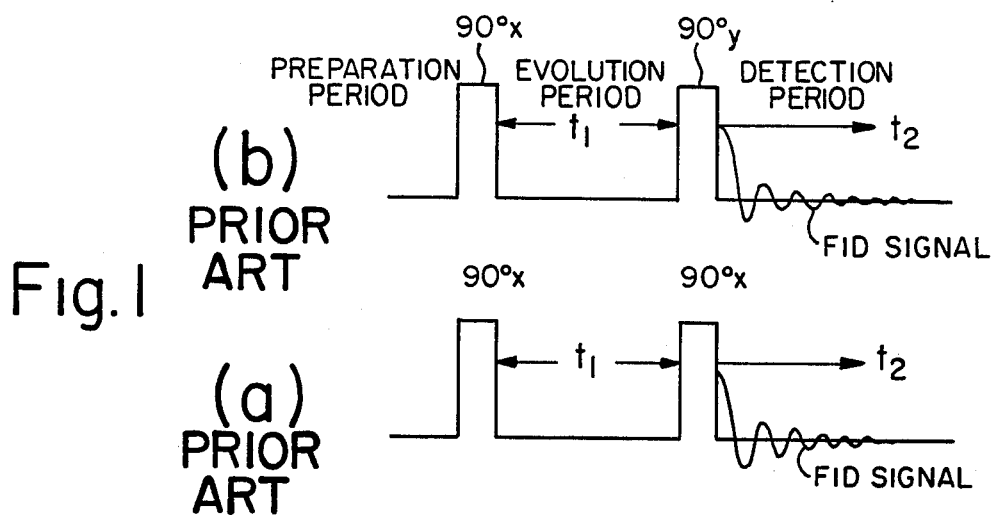
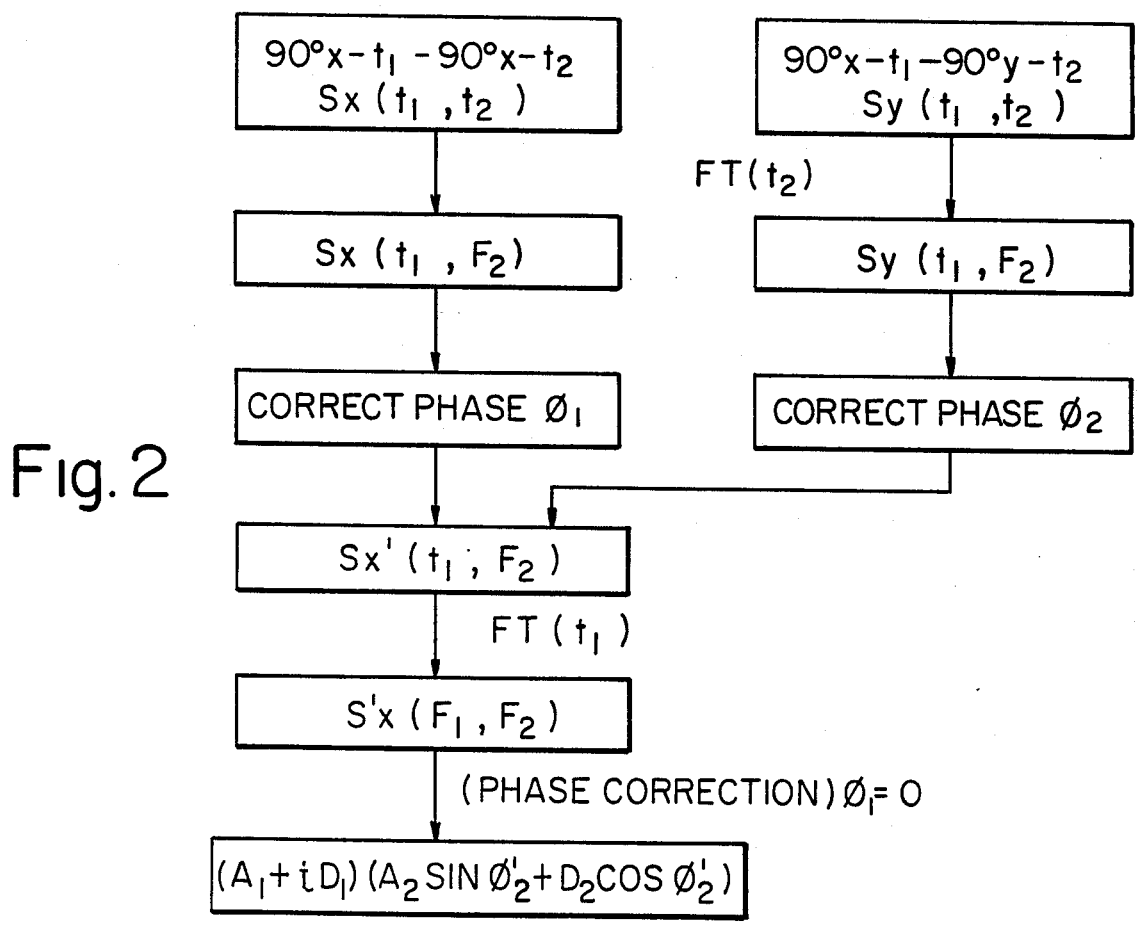

PHASE CORRECTION METHOD IN TWO-DIMENSIONAL NMR SPECTROSCOPY

FIELD OF THE INVENTION

The present invention relates to two-dimensional nuclear magnetic resonance (NMR) spectroscopy and, more particularly, to a method of making phase corrections to obtain pure absorption 2D spectroscopy.

BACKGROUND OF THE INVENTION

In two-dimensional nuclear magnetic resonance (2D NMR) spectroscopy, NMR signals are displayed as two-dimensional spectra. Therefore, 2D NMR spectroscopy offers higher resolution and makes it easier to elucidate the spectra than the conventional NMR spectroscopy. Also, it permits the elucidation of nuclear spin-spin interaction. Further, 2D NMR spectroscopy has other advantages.

The prior art 2D NMR experiment is now described in detail by referring to FIG. 1($a$), where a pulse sequence with two 90°×pulses is used. A general process of measurement by 2D NMR spectroscopy consists of a preparation period preceding the first 90° pulse, an evolution period of $t_1$, and a detection period of $t_2$. The preparation period is necessary to maintain the nuclear spin magnetization in its appropriate initial condition. The preparation pulse, or the first 90° pulse, brings the magnetization into non-equilibrium state. This state is caused to evolve in the evolution period $t_1$. In the detection period $t_2$ subsequent to the application of the detection pulse, or the second 90° pulse, the resulting free induction decay signal is detected. The phase and the amplitude of this decay signal reflect the behavior of the magnetization taken in the evolution period $t_1$. The period $t_1$ is varied so as to assume n discrete values. A measurement is made at each of these discrete values, using two detection systems to detect signals which are 90° out of phase with each other, i.e., by quadrature detection. A combination of m free induction decay signals FIDa1-FIDam detected with one of the detection systems is used as the real part of a complex NMR spectrum $S_1(t_1, t_2)$. A combination of m free induction decay signals FIDb1-FIDbm detected with the other detection system is employed as the imaginary part of the complex NMR spectrum. The obtained data contains not only the information about the behavior of the magnetization in the period $t_2$ but also the information regarding the behavior of the magnetization in the period $t_1$.

Referring next to FIG. 1($b$), a pulse sequence which is similar to the pulse sequence shown in FIG. 1($a$) except that the phase of the detection pulse is shifted by 90°. Measurements are made at the same number of values of $t_1$ as the foregoing values to obtain a complex NMR spectrum $S_2(t_1, t_2)$. This spectrum, recorded on a plane, have diagonal peaks which appear symmetrically and cross-peaks also appearing symmetrically. All the peaks are mixtures of absorption and dispersion waveforms. Thus, it is difficult to analyze the spectrum.

In order to avoid this problem, a two-dimensional absorption spectrum is displayed in the directions of two frequencies $\omega_1$ and $\omega_2$. Thus, pure absorption 2D spectrum is obtained (D. J. States et al. *Journal of Magnetic Resonance* 48, 286 (1982); D. Marion and K. Wuthrich, *Biochem. Biophys. Res. Commu.*, 113, 967 (1983)). This conventional phase detection method is next described by referring to FIG. 2.

First, the x-component $S_x(t_1, t_2)$ of a spectrum obtained using a pulse sequence of 90°x−$t_1$−90°y−$t_2$ is stored in a memory. The y-component $S_y(t_1, t_2)$ of the spectrum obtained using the pulse sequence 90°x−$t_1$−90°y−$t_2$ is stored in another memory. These components are subjected to Fourier transformation with respect to the axis $t_2$. The phase $\phi_2$ of the Fourier-transformed signals is corrected. The imaginary part of the complex spectrum is replaced with the real part of $S_y(t_1, F_2)$ whose phase has been shifted by 90°. On the other hand, the real part of the complex spectrum is left as it is. In the practical measurement, quadrature detection is employed. The obtained spectrum $S_x'(t_1, F_2)$ is subjected to Fourier transformation with respect to the axis $t_1$, resulting in a spectrum $S_x'(t_1, F_2)$. Then, a phase correction is made under the condition of $\phi_1=0$. Consequently, the real part of the obtained spectrum represents a pure absorption waveform.

In the conventional phase correction method, however, when the first phase $\phi_2$ is corrected, the human operator's experience or intuition is needed except where the amount of correction to be made to the phase $\phi_2$ is known by some means or other. Therefore, it is difficult to achieve a perfect phase correction. For this reason, after a phase correction is made under the condition of $\phi_1=0$, the spectrum $S_x'(F_1, F_2)$ takes the form $$(A_1+iD_1)(A_2 \sin \phi_2' + D_2 \cos \phi_2')$$

as shown in FIG. 2. As a result, the component including the phase $\phi_2'$ remains.

SUMMARY OF THE INVENTION

It is a main object of the invention to provide a method of making phase corrections precisely along the two axes of a two-dimensional NMR spectrum without resorting to human intuition.

The above object is achieved by a method comprising the steps of: applying a first pulse or pulse train to a sample; applying a second pulse or pulse train to the sample when an evolution period or $t_1$ elapses after the application of the first pulse or pulse train; then detecting the free induction decay signal emanating from the sample during a detection period of $t_2$, using a quadrature detection system; repeating the above process with different values of $t_1$ to obtain a complex NMR spectrum $S_1(t_1, t_2)$; exciting the sample with a pulse sequence which is similar to the first-mentioned pulse sequence except that the second pulse or pulse train of this sequence is shifted in phase by 90°/n (n is a natural number) with respect to the second pulse or pulse train of the first-mentioned pulse sequence; detecting the resulting free induction decay signal; repeating this process with the same number of values of $t_1$ as the first-mentioned values of $t_1$ to obtain a complex NMR spectrum $S_2(t_1, t_2)$; subjecting the spectra $S_1(t_1, t_2)$ and $S_2(t_1, t_2)$ to complex Fourier transformation with respect to the axis $t_2$ to obtain spectra $S_1(t_1, F_2)$ and $S_2(t_1, F_2)$; interchanging the imaginary part of $S_1(t_1, F_2)$ and the real part of $S_2(t_1, F_2)$ to give rise to $S_1'(t_1, F_2)$ and $S_2'(t_1, F_2)$; subjecting $S_1'(t_1, F_2)$ and $S_2'(t_1, F_2)$ to complex Fourier transformation with respect to the axis $t_1$ to obtain $S_1'(F_1, F_2)$ and $S_2'(F_1, F_2)$; correcting the phase along one of the axes; interchanging the imaginary part of $S_1'(F_1, F_2)$ and the real part of $S_2'(F_1, F_2)$; and correcting the phase along the other axis.

This method permits the phase to be corrected along both axes $t_1$ and $t_2$.

BRIEF DESCRIPTION OF THE DRAWINGS

FIGS. 1(a) and 1(b) are diagrams of sequences of pulses applied to a sample to examine it by 2D NMR spectroscopy;

FIG. 2 is a flowchart for illustrating the conventional phase correction method;

DESCRIPTION OF THE PREFERRED EMBODIMENTS

Figure 3:
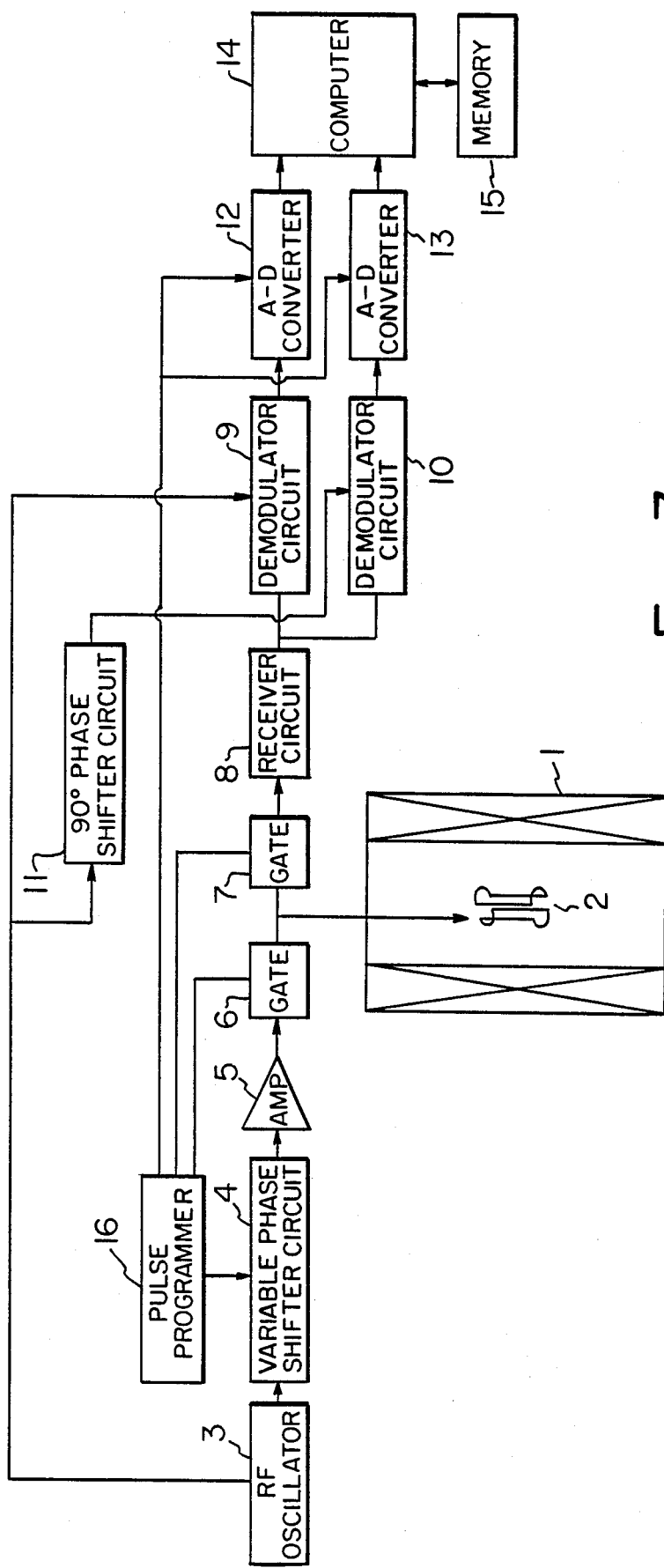
FIG. 3 is a block diagram of an instrument for executing a method according to the invention.

Referring to FIG. 3, there is shown a nuclear magnetic resonance (NMR) spectrometer for executing a method according to the invention. This spectrometer has a magnet 1 for producing a static magnetic field in which a transmitter coil 2 is placed. A sample to be investigated is inserted in the space within the coil 2. An RF oscillator 3 generates an RF signal including the resonance frequency of the nuclei under observation. A variable phase shifter circuit 4 that can select any desired phase from 0° to 360° imparts a given phase to the RF signal. The output signal from the phase shifter circuit 4 is passed through an amplifier 5 and a gate 6 and then supplied as RF pulses to the coil 2, so that the RF pulses are applied to the sample. The resonance signal induced in the coil 2 is fed to demodulator circuits 9 and 10 via a second gate 7 and a receiver circuit 8. The RF oscillator circuit 3 supplied the RF signal as a reference signal to the demodulator circuits 9 and 10. One of the demodulator circuits receives the reference signal through a 90° phase shifter circuit 11 and so these two demodulator circuits 9 and 10 constitute a quadrature detection system. The free induction decay signals delivered from the demodulator circuits 9 and 10 are fed to analog-to-digital converters 12 and 13, respectively, which convert their input analog signals into digital form. The output signals from the converters 12 and 13 are furnished to a computer 14 and stored in a memory 15 ancillary to the computer. A pulse programmer 16 controls the operation of the phase shifter circuit 4, the gates 6, 7, and the AD converters 12, 13. The programmer 16 has been previously programmed with the sequence of a pulse train applied to the sample and also with the instants at which the NMR signal is sampled by the AD converters 12 and 13. A series of measurements is made according to the program.

Figure 4:
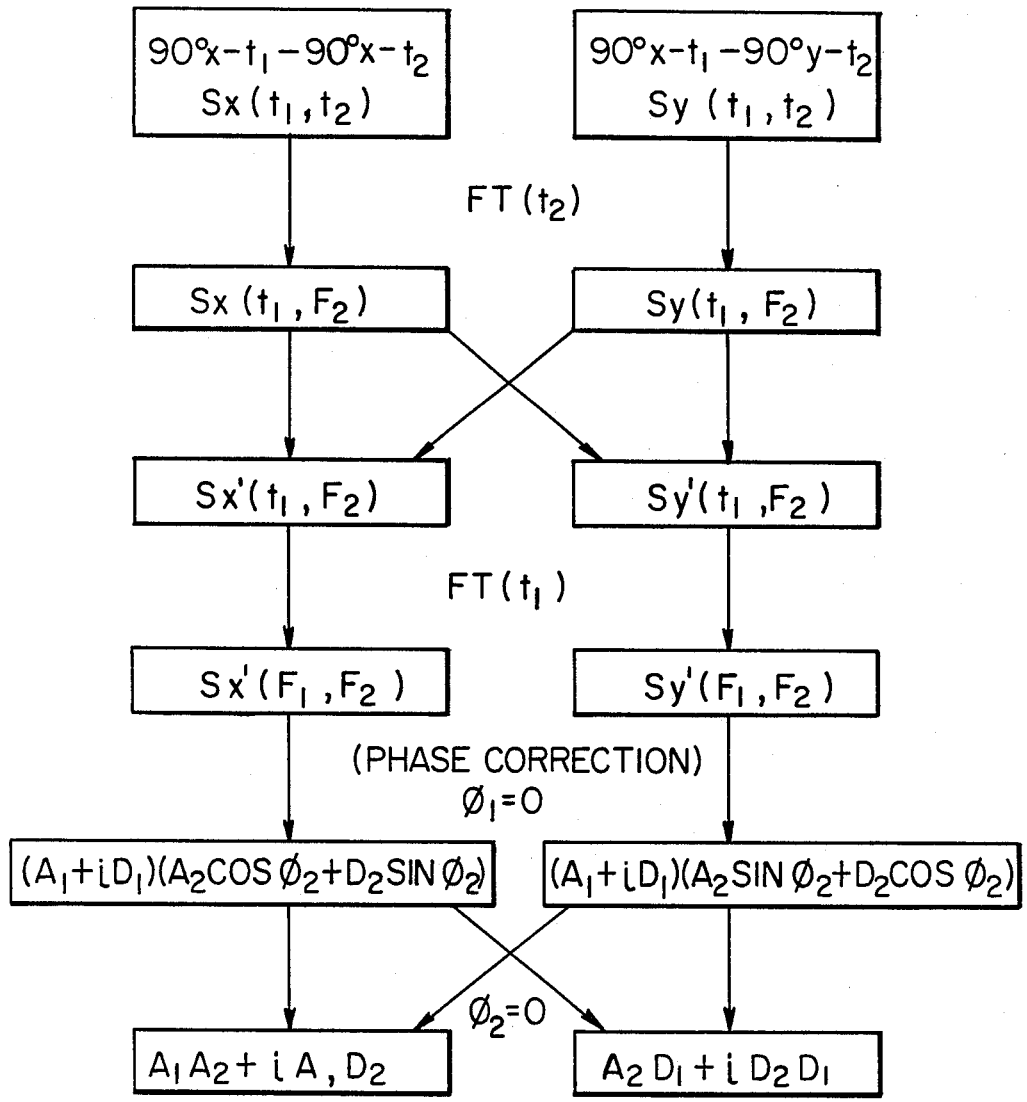
FIG. 4 is a flowchart for illustrating a phase correction method according to the invention.

FIG. 4 is a flowchart for illustrating a phase correction method according to the invention. In order to carry out this method, a program for generating the pulse sequences shown in FIGS. 1(a) and 1(b) is loaded into the pulse programmer 16 of the instrument shown in FIG. 3. The pulse sequences of $90°x-t_1-90°x-t_2$ and $90°x-t_1-90°y-t_2$ are successively produced while the value of $t_1$ is varied in a stepwise fashion. The x-component $S_x(t_1, t_2)$ and the y-component $S_y(t_1, t_2)$ of the resultant free induction decay signal which are delivered from the AD converters 12 and 13, respectively, are fed to the computer 14 and stored in the memory 15. The computer 14 takes the Fourier transforms of $S_x(t_1, t_2)$ and $S_y(t_1, t_2)$ with respect to the axis $t_2$ and expand the components as follows:

$S_x(t_1, F_2) = M_0 \cos(\omega_1 t_1 + \phi_1) \exp(-t_1/T_2) \times [\{A(\omega_2) \cos \phi_2 + D(\omega_2) \sin \phi_2\} + i\{A(\omega_2) \sin \phi_2 + D(\omega_2) \cos \phi_2\}]$ $S_y(t_1, F_2) = -M_0 \sin(\omega_1 t_1 + \phi_1) \exp(-t_1/T_2) \times [\{A(\omega_2) \cos \phi_2 + D(\omega_2) \sin \phi_2\} + i\{A(\omega_2) \sin \phi_2 + D(\omega_2) \cos \phi_2\}]$ Then, the imaginary part of $S_x(t_1, F_2)$ and the real part of $S_y(t_1, F_2)$ are interchanged and converted into $S_x'(t_1, F_2)$ and $S_y'(t_1, F_2)$ given by $S_x'(t_1, F_2) = M_0 \exp\{-i(\omega_1 t_1 + \phi_1)\} \exp(-t_1/T_2) \times [\{A(\omega_2) \cos \phi_2 + D(\omega_2) \sin \phi_2\}$ $S_y'(t_1, F_2) = M_0 \exp\{-i(\omega_1 t_1 + \phi_1)\} \exp(-t_1/T_2) \times [\{A(\omega_2) \sin \phi_2 + D(\omega_2) \cos \phi_2\}$ Subsequently, the computer takes the Fourier transforms of $S_x'(t_1, F_2)$ and $S_y'(t_1, F_2)$ with respect to the axis $t_1$ to give rise to $S_x'(F_1, F_2) = M_0[A(\omega_1) \cos \phi_1 + D(\omega_1) \sin \phi_1 + i\{A(\omega_1) \sin \phi_1 + D(\omega_1) \cos \phi_1\}] \times \{A(\omega_2) \cos \phi_2 + D(\omega_2) \sin \phi_2\}$ $S_y'(F_1, F_2) = M_0[A(\omega_1) \cos \phi_1 + D(\omega_1) \sin \phi_1 + i\{A(\omega_1) \sin \phi_1 + D(\omega_1) \cos \phi_1\}] \times \{A(\omega_2) \sin \phi_2 + D(\omega_2) \cos \phi_2\}$ $S_x'(F_1, F_2)$ and $S_y'(F_1, F_2)$ are expressed as follows:

$S_x'(F_1, F_2) = M_0[A(\omega_1) \exp(i\phi_1) + D(\omega_1) \exp\{i(90°-\phi_1)\}] \times \{A(\omega_2) \cos \phi_2 + D(\omega_2) \sin \phi_2\}$ $S_y'(F_1, F_2) = M_0[A(\omega_1) \exp(i\phi_1) + D(\omega_1) \exp\{i(90°-\phi_1)\}] \times \{A(\omega_2) \sin \phi_2 + D(\omega_2) \cos \phi_2\}$ As can be seen from these formulae, it is possible to determine the amount of phase correction $\phi_1$. Thus, the computer 14 corrects the phase under the condition of $\phi_1 = 0$, i.e., along the axis $F_1$. Note that the value of $\phi_1$ is the same for both $S_x'(F_1, F_2)$ and $S_y'(F_1, F_2)$. That is, $S_x'(F_1, F_2)(\omega_1=0) = M_0\{A(\omega_1) + iD(\omega_1)\}\{A(\omega_2) \cos \phi_2 + D(\omega_2) \sin \phi_2\}$ $S_y'(F_1, F_2)(\omega_1=0) = M_0\{A(\omega_1) + iD(\omega_1)\}\{A(\omega_2) \sin \phi_2 + D(\omega_2) \cos \phi_2\}$ The imaginary part of $S_x'(F_1, F_2)(\phi_1=0)$ and the real part of $S_y'(F_1, F_2)(\phi_1=0)$ are interchanged. At this time, $S_x(F_1, F_2)(\phi_1=0)$ and $S_y(F_1, F_2)(\phi_1=0)$ are given by $S_x(F_1, F_2)(\phi_1=0) = M_0 A(\omega_1)\{A(\omega_2)(\cos \phi_2 + i \sin \phi_2) + D(\omega_2)(\sin \phi_2 + i \cos \phi_2)\} = M_0 A(\omega_1)[A(\omega_2) \exp(i\phi_2) + D(\omega_2) \exp\{i(90°-\phi_2)\}]$ $S_y(F_1, F_2)(\phi_1=0) = M_0 D(\omega_2)\{A(\omega_2)(\cos \phi_2 + i \sin \phi_2) + D(\omega_2)(\sin \phi_2 + i \cos \phi_2)\} = M_0 D(\omega_1)[A(\omega_2) \exp(i\phi_2) + D(\omega_2) \exp\{i(90°-\phi_2)\}]$ As can been seen from these formulae, the amount of phase correction $\phi_2$ made along the axis $F_2$ can be determined. The computer 14 corrects the phase under the condition of $\phi_2 = 0$. As a result, the above formulae are given by $S_x(F_1, F_2)(\phi_1, \phi_2=0) = M_0 A(\omega_1)\{A(\omega_2) + iD(\omega_2)\}$ $S_y(F_1, F_2)(\phi_1, \phi_2=0) = M_0 D(\omega_1)\{A(\omega_2) + iD(\omega_2)\}$ The real part of the above formula is $M_0A(\omega_1)A(\omega_2)$, which means a pure absorption waveform. The pure absorption 2D spectrum is displayed on a display device (not shown) connected with the computer 14.

The same results can be obtained by reversing the order of phase corrections along the axes $F_1$ and $F_2$, interchanging the imaginary part of $S_x'(F_1, F_2)$ and the real part of $S_y'(F_1, F_2)$ under the condition of $\phi_2=0$, and then making $\phi_1$ equal to zero.

In the above example, the phase of the second pulse is shifted by 90°. Where the invention is applied to multiple-quantum coherence or multiple-quantum filtering that is a kind of 2D NMR spectroscopy, the amount of phase correction is not 90° but 90°/n (n=2, 3, ...). Generally, the amount of phase correction is 90° but 90°/n (n=1, 2, 3, ...). The invention is applicable to all 2D NMR spectroscopy including multiple-quantum coherence and multiple-quantum filtering.

Having thus described our invention with the detail and particularity required by the Patent Laws, what is claimed and desired to be protected by Letters Patents is set forth in the following claims:

1. A method of correcting the phase of a two-dimensional NMR spectrum, comprising the steps of:
   applying a first pulse or pulse train to a sample;
   applying a second pulse or pulse train to the sample when an evolution period of $t_1$ elapses after the application of the first pulse or pulse train;
   then detecting the free induction decay signal emanating from the sample during a detection period of $t_2$, using a quadrature detection system;
   repeating the above process with different values of $t_1$ to obtain a complex NMR spectrum $S_1(t_1, t_2)$;
   exciting the sample with a pulse sequence which is similar to the first-mentioned pulse sequence except that the second pulse or pulse train of this sequence is shifted in phase by 90°/n wherein n is a natural number, with respect to the second pulse or pulse train of the first-mentioned pulse sequence;
   detecting the resulting free induction decay signal;
   repeating this process with the same number of values of $t_1$ as the first-mentioned values of $t_1$ to obtain a complex NMR spectrum $S_2(t_1, t_2)$;
   subjecting the spectra $S_1(t_1, t_2)$ and $S_2(t_1, t_2)$ to complex Fourier transformation with respect to the axis $t_2$ to obtain spectra $S_1(t_1, F_2)$ and $S_2(t_1, F_2)$
   interchanging the imaginary part of $S_1(t_1, F_2)$ and the real part of $S_2(t_1, F_2)$ to give rise to $S_1'(t_1, F_2)$ and $S_2'(t_1, F_2)$;
   subjecting $S_1'(t_1, F_2)$ and $S_2'(t_1, F_2)$ to complex Fourier transformation with respect to the axis $t_1$ to obtain $S_1'(F_1, F_2)$ and $S_2'(F_1, F_2)$;
   correcting the phase along one of the axes;
   interchanging the imaginary part of $S_1'(F_1, F_2)$ and the real part of $S_2'(F_1, F_2)$; and
   correcting the phase along the other axis.

2. A method of correcting the phase of a two-dimensional NMR spectrum, comprising the steps of:
   applying a first pulse or pulse train to a sample;
   applying a second pulse or pulse train to the sample when an evolution period of $t_1$ elapses after the application of the first pulse or pulse train;
   then detecting the free induction decay signal emanating from the sample during a detection period of $t_2$, using a quadrature detection system;
   repeating the above process with different values of $t_1$ to obtain a complex NMR spectrum $S_x(t_1, t_2)$;
   exciting the sample with a pulse sequence which is similar to the aforementioned pulse sequence except that the second pulse or pulse train of this sequence is shifted in phase by 90° with respect to the second pulse or pulse train of the first-mentioned pulse train;
   detecting the resulting free induction decay signal;
   repeating this process with the same number of values of $t_1$ as the first-mentioned values of $t_1$ to obtain a complex NMR spectrum $S_y(t_1, t_2)$;
   subjecting the spectra $S_x(t_1, t_2)$ and $S_y(t_1, t_2)$ to complex Fourier transformation with respect to the axis $t_2$ to obtain spectra $S_x(t_1, F_2)$ and $S_y(t_1, F_2)$;
   interchanging the imaginary part of $S_x(t_1, F_2)$ and the real part of $S_y(t_1, F_2)$ to give rise to $S_x'(t_1, F_2)$ and $S_y'(t_1, F_2)$;
   subjecting $S_x'(t_1, F_2)$ and $S_y'(t_1, F_2)$ to complex Fourier transformation with respect to the axis $t_1$ to obtain $S_x'(F_1, F_2)$ and $S_y'(F_1, F_2)$;
   correcting the phase along the axis $F_1$;
   interchanging the imaginary part of $S_x'(F_1, F_2)$ and the real part of $S_y'(F_1, F_2)$; and
   correcting the phase along the axis $F_2$.

3. A method of correcting the phase of a two-dimensional NMR spectrum, comprising the steps of:
   applying a first pulse or pulse train to a sample;
   applying a second pulse or pulse train to the sample when a evolution period of $t_1$ elapses after the application of the first pulse or pulse train;
   then detecting the free induction decay signal emanating from the sample during a detection period of $t_2$, using a quadrature detection system;
   repeating the above process with different values of $t_1$ to obtain a complex NMR spectrum $S_x(t_1, t_2)$;
   exciting the sample with a pulse sequence which is similar to the aforementioned pulse sequence except that the second pulse or pulse train of this sequence is shifted in phase by 90° with respect to the second pulse or pulse train of the first-mentioned pulse sequence;
   detecting the resulting free induction decay signal;
   repeating this process with the same number of values of $t_1$ as the first-mentioned values of $t_1$ to obtain a complex NMR spectrum $S_y(t_1, t_2)$;
   subjecting the spectra $S_x(t_1, t_2)$ and $S_y(t_1, t_2)$ to complex Fourier transformation with respect to the axis $t_2$ to obtain spectra $S_x(t_1, F_2)$ and $S_y(t_1, F_2)$;
   interchanging the imaginary part of $S_x(t_1, F_2)$ and the real part of $S_y(t_1, F_2)$ to give rise to $S_x'(t_1, F_2)$ and $S_y'(t_1, F_2)$;
   subjecting $S_x'(t_1, F_2)$ and $S_y'(t_1, F_2)$ to complex Fourier transformation with respect to the axis $t_1$ to obtain $S_x'(F_1, F_2)$ and $S_y'(F_1, F_2)$;
   interchanging the imaginary part of $S_x'(F_1, F_2)$ and the real part of $S_y'(F_1, F_2)$ to give rise to $S_x(F_1, F_2)$ and $S_y(F_1, F_2)$;
   correcting the phase along the axis $F_2$;
   interchanging the imaginary part of $S_x'(F_1, F_2)$ and the real part of $S_y'(F_1, F_2)$; and
   correcting the phase along the axis $F_1$.

* * * * *

UNITED STATES PATENT AND TRADEMARK OFFICE
CERTIFICATE OF CORRECTION

PATENT NO. : 4,766,377
DATED : August 23, 1988
INVENTOR(S) : Muneki Ohuchi and Soukichi Uchida It is certified that error appears in the above-identified patent and that said Letters Patent is hereby corrected as shown below:

Title page:

After the line listing the application serial number insert
--Foreign Application Priority Data
October 24, 1986 Japan 61-253142--.

In the Abstract Line 3 "phase" should read --pulse--.

Column 4 Line 42 "$(\omega_1=0)$" should read --$(\phi_1=0)$--.

Column 4 Line 44 "$(\omega_1=0)$" should read --$(\phi_1=0)$--.

Signed and Sealed this

Eighteenth Day of April, 1989

*Attest:*

DONALD J. QUIGG

*Attesting Officer*     *Commissioner of Patents and Trademarks*